United States Patent
Park et al.

(10) Patent No.: US 7,071,016 B2
(45) Date of Patent: Jul. 4, 2006

(54) MICRO-ELECTRO MECHANICAL SYSTEMS (MEMS) DEVICE USING SILICON ON INSULATOR (SOI) WAFER, AND METHOD OF FABRICATING AND GROUNDING THE SAME

(75) Inventors: Kyu Yeon Park, Kyungki-do (KR); Ki Hoon Kim, Seoul (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 0 days.

(21) Appl. No.: 10/915,551

(22) Filed: Aug. 11, 2004

(65) Prior Publication Data

US 2005/0009233 A1    Jan. 13, 2005

Related U.S. Application Data

(63) Continuation of application No. 10/601,775, filed on Jun. 24, 2003, now abandoned.

(30) Foreign Application Priority Data

Nov. 27, 2002  (KR) ................. 2002-74503

(51) Int. Cl.
*H01L 21/00*    (2006.01)
(52) U.S. Cl. .......................................... 438/48; 438/51
(58) Field of Classification Search ............. 438/48–54
See application file for complete search history.

(56) References Cited

U.S. PATENT DOCUMENTS

2002/0060297 A1*  5/2002  Konishi et al. .......... 250/492.1

* cited by examiner

*Primary Examiner*—H. Jey Tsai
(74) *Attorney, Agent, or Firm*—Lowe Hauptman & Berner, LLP.

(57) ABSTRACT

An MEMS device using an SOI wafer includes a first silicon layer, an insulation layer formed on the first insulation layer, a second silicon layer formed an the insulation layer, a protective layer formed on the second silicon layer, and a ground hole extending from an upper portion of the protective layer to the first silicon layer and having a conductive material therein. A handle wafer in the MEMS device is connected to the ground hole without performing any additional wiring or bonding process.

4 Claims, 8 Drawing Sheets

PRIOR ART

FIG. 1

PRIOR ART

FIG. 2

PRIOR ART

MICRO-ELECTRO MECHANICAL SYSTEMS (MEMS) DEVICE USING SILICON ON INSULATOR (SOI) WAFER, AND METHOD OF FABRICATING AND GROUNDING THE SAME

RELATED APPLICATIONS

The present application is a continuation of U.S. patent application Ser. No. 10/601,775, filed Jun. 24, 2003, now abandoned, the disclosure of which is hereby incorporated by reference herein in its entirety.

BACKGROUND OF THE INVENTION

1. Field of the Invention

The present invention relates in general to a micro-electro mechanical systems (MEMS) device using a silicon-on-insulator (SOI) wafer, and more particularly to an MEMS device using an SOI wafer in which a handle wafer of the SOI wafer is connected to a ground hole without any additional bonding or wiring process, and a method for fabricating and grounding the same.

2. Description of the Related Art

An MEMS device is a product implemented by combining micro-mechanical components such as micro-sensors, micro-valves, micro-gears, micro-mirrors and micro-actuators formed in a semiconductor chip and a computer technology, and thus called an "intelligent product". An MEMS device may further include microcircuits in the semiconductor chip having the micro-mechanical components thereon. Such MEMS devices may be produced cost effectively for a wide variety of applications because they can be fabricated with at low cost in large volumes. In such a MEMS device, if a handle wafer (base wafer) of an SOI wafer in the MEMS device is electrically floated, parasitic capacitance between the handle wafer and a structure formed on the SOI wafer for acting as a micro-mechanical component causes electrical interference that may negatively influence the micro-mechanical component such as an actuator or a sensor. Accordingly, the handle wafer should be electrically connected to a ground area for preventing the parasitic capacitance.

Figure 1:
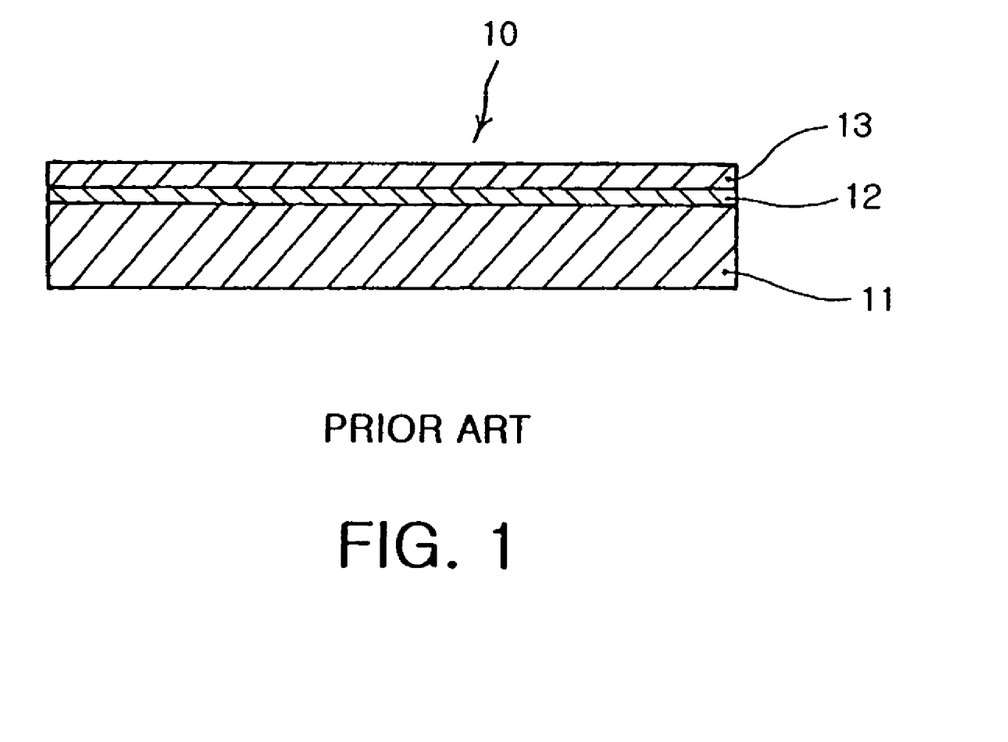
FIG. 1 is a sectional view of an SOI wafer.

FIG. 1 illustrates a sectional view of a typical SOI wafer 10. Referring to FIG. 1, the SOI wafer comprises a handle wafer 11 serving as a base wafer, a device wafer 13 provided over the handle wafer 11 and a sacrificial layer 12 formed of an insulation layer and interposed between the handle wafer 11 and the device wafer 13.

The handle wafer 11 has a thickness of several hundreds of μms and serves as a substrate in general semiconductor devices. The device wafer 13 has a thickness from several tens to several hundreds of μms and the thickness of the device wafer 13 may vary based on products. The device wafer 13 may has a desired structure by being etched. The sacrificial layer 12 is made of silicon oxide. In the case that the desired structure is a gyroscope or accelerometer, the sacrificial layer 12 may be removed for providing a vacant space under the desired structure so that the desired structure is allowed to move in the MEMS device.

Figure 2:
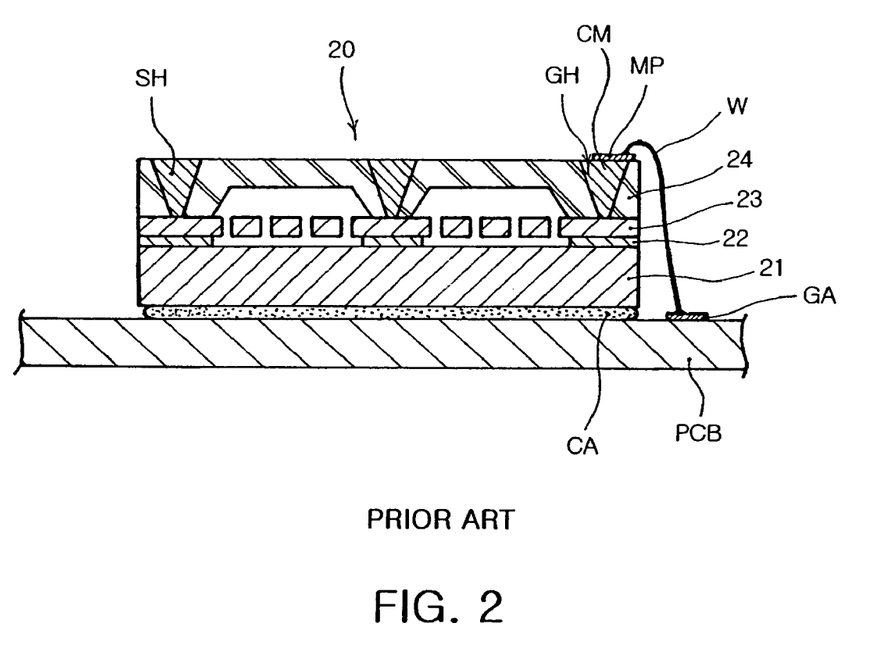
FIG. 2 is a sectional view of a wire bonding type MEMS device in accordance with the conventional art.

FIG. 2 illustrates a sectional view of a conventional wire bonding type MEMS device. Referring to FIG. 2, the wire bonding type MEMS device 20 comprises a first silicon layer 21 corresponding to a handle wafer, an insulation layer 22 formed of silicon oxide, a second silicon layer 23 corresponding to a device wafer, and a protective layer 24 formed of glass material. The protective layer 24 has a signal hole SH and a ground hole GH therein. The signal hole SH and the ground hole are filled with a conductive material layer CM. A metal pad MP is formed on the upper surface of the conductive material layer CM in the ground hole GH.

The handle wafer 21 is attached to a grounded surface of a printed circuit board PCB by a conductive adhesive. The metal pad MP formed on the conductive metal layer CM in the ground hole GH is connected to a ground area GA on the PCB by a wire bonding method. The MEMS device 20 is encapsulated with a resin such as epoxy by transfer molding.

The wire bonding type MEMS device described above has a drawback that a wire bonding process is necessarily required to connect the metal pad in the ground hole GH to the ground area GA of the PCB, thereby causing inconvenience. The wire bonding type MEMS device in accordance with the conventional art is further disadvantageous in that contact reliability is degraded, even in the case that the conductive adhesive is used, because a natural oxide layer is formed on a silicon surface even when the silicon surface is exposed to the air for a certain period of time.

Figure 3:
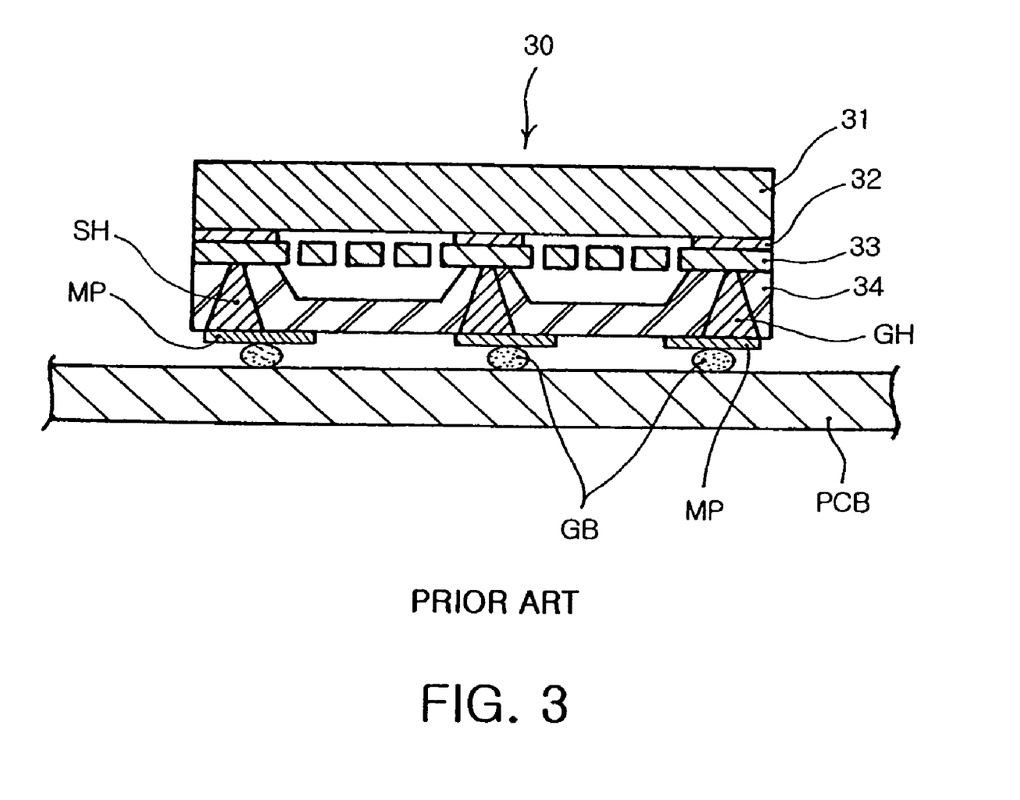
FIG. 3 is a sectional view of a gold flip chip bonding type MEMS device in accordance with the conventional art.

On the other hand, as shown in FIG. 3, a gold flip chip bonding type MEMS device has been recently developed and it is advantageous in terms of miniaturization and noise reduction. Details of the gold flip chip bonding type MEMS device will be described below with reference to FIG. 3.

FIG. 3 is a sectional view of a conventional gold flip chip bonding type MEMS device 30. The gold flip chip bonding type MEMS device is packaged by using a gold bump flip chip bonding method which is a sort of flip chip bonding method. The basic structure of the gold flip chip bonding type MEMS device 30 is the same as the wire bonding type MEMS device 20 shown in FIG. 2. However, the gold flip chip bonding type MEMS device 30 is different from the wire bonding type MEMS 20 in terms of the mounting direction to the PCB.

As shown in FIG. 3, the gold bump flip chip MEMS device 30 comprises a first silicon layer 31 corresponding to a handle wafer, an insulation layer 32 formed of silicon oxide, a second silicon layer 33 corresponding to a device wafer, and a protective layer 34 made of glass material. The protective layer 34 has a signal hole SH and a ground hole GH, both of which are filled with a conductive material layer CM. The conductive materials CM in the signal hole and the ground hole are connected to respective metal pads MP. The respective metal pads MP in the signal hole SH and the ground hole GH are connected to a signal and ground areas on a printed circuit board PCB with respective gold balls GB.

For the gold bump flip chip bonding, a gold ball is placed between the respective metal pads MP on the MEMS device 30 and the associated signal or ground area on the PCB, and ultrasonic vibration and pressure are applied to the MEMS device 30 while the MEMS device 30 maintains a desired temperature. Such gold flip chip bonding type MEMS device is advantageous in terms of miniaturization and noise reduction characteristics.

The gold flip chip bonding type MEMS device, however, is disadvantageous in that it is difficult to connect an upper substrate (handle wafer) of the MEMS device to a printed circuit board. Accordingly, there are grounding problems even in the flip chip bonding method that is a new technology attracting a great deal of attention.

SUMMARY OF THE INVENTION

Therefore, the present invention has been made in view of the above problem, and it is an object of the present invention to provide an MEMS device using an SOI wafer in which a handle wafer in the MEMS device may be easily connected to a ground hole without using any additional wiring process, and a method for fabricating and grounding the same.

In accordance with one aspect of the present invention, there is provided an MEMS device using an SOI wafer comprising a first silicon layer, an insulation layer formed on the first silicon layer, a second silicon layer formed on the insulation layer, a protective layer formed on the second silicon layer, and a ground hole extending from an upper portion of the protective layer to the first silicon layer and having a conductive material layer therein.

In the MEMS device, the second silicon layer preferably has a structure acting as device components of an MEMS device.

In the MEMS device, the insulation layer preferably includes a vacant space under the structure.

In the MEMS device, the ground hole is completely filled with the conductive material layer, whereby the ground hole is electrically connected from a lower portion thereof to an upper portion of the protective layer.

In the MEMS device, the conductive material layer is preferably formed along an inner surface of the ground hole by using a deposition process or a plating process, whereby the ground hole is electrically connected from a lower portion thereof to an upper portion of the protective layer.

In accordance with another aspect of the present invention, there is provided a method for fabricating and grounding an MEMS device using an SOI wafer, comprising a first step of preparing a first silicon layer, a second step of forming an insulation layer on the first silicon layer, a third step of forming a second silicon layer on the insulation layer, a fourth step of forming a protective layer on the second silicon layer, a fifth step of forming a signal hole and a ground hole in the protective layer and extending the ground hole to the first silicon layer through the second silicon layer and the insulation layer, and a sixth step of forming a conductive material layer in the ground hole.

In the method, the fifth step preferably includes a sub-step of applying a dry film resist on the protective layer while uncovering the ground hole, and a sub-step of extending the ground hole to the first silicon layer by etching the second silicon layer and the insulation layer in the ground hole.

In the method, the fifth step preferably includes a sub-step of applying a dry film resist on the protective layer while uncovering the ground hole, and a sub-step of extending the ground hole to the first silicon layer through the second silicon layer and the insulation layer by injecting sand powder into the ground hole.

In the method, the sand powder is preferably injected into the ground hole through sand blaster nozzles.

In accordance with further another aspect of the present invention, there is provided a method for fabricating and grounding an MEMS device using an SOI wafer, comprising a first step of preparing a first silicon layer, a second step of forming an insulation layer on the first silicon layer, a third step of forming a second silicon layer on the insulation layer and forming a desired structure on the second silicon layer along with slits which are formed to penetrate the second silicon layer at a location where a ground hole is to be formed, a fourth step of forming a protective layer on the second silicon layer, a fifth step of forming a signal hole and a ground hole in the protective layer and extending the ground hole to the first silicon layer through the second silicon layer and the insulation layer, and a sixth step of forming a conductive material layer in the ground hole.

In the method according to the third aspect of the present invention, the fifth step preferably comprises a sub-step of etching the second silicon layer and the insulation layer in the ground hole, thereby extending the ground hole to the first silicon layer.

In the method according to the third aspect of the present invention, the fifth step preferably comprises a sub-step of injecting sand power into the ground hole, thereby extending the ground hole to the first silicon layer through the second silicon layer and the insulation layer.

In the method according to the third aspect of the present invention, the sand powder is preferably injected into the ground hole through sand blaster nozzles.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 4:
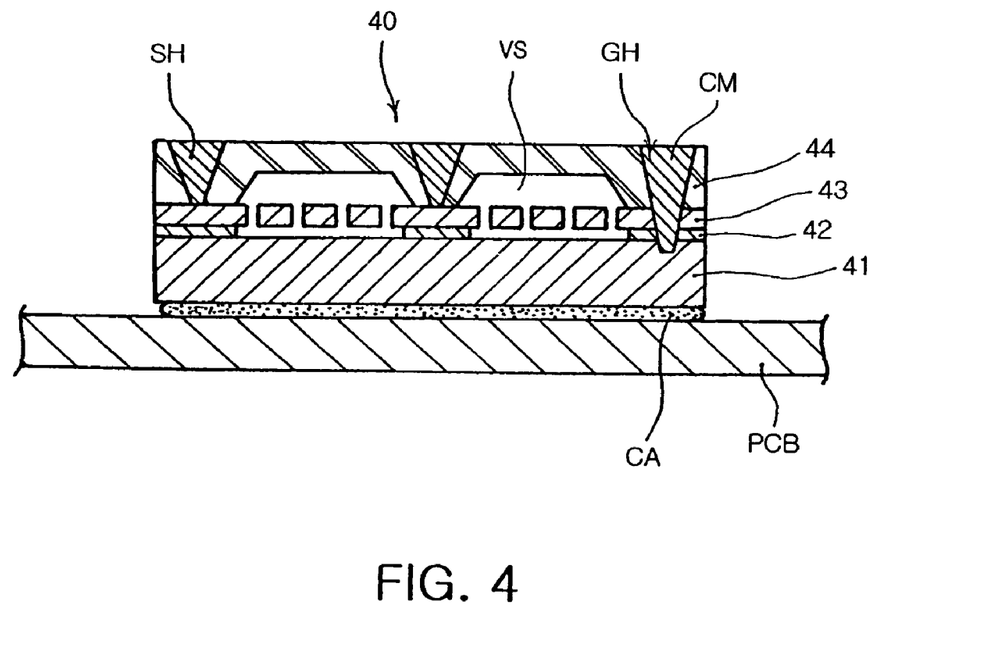
FIG. 4 is a sectional view of an MEMS device in accordance with the present invention.

FIG. 4 illustrates an MEMS device using an SOI wafer in accordance with a first aspect of the present invention. In drawings accompanied herewith, like elements are designated by a like reference number.

Referring to FIG. 4, the MEMS device 40 comprises a first silicon layer 41, an insulation layer 42 formed on the first silicon layer 41 and a second silicon layer 43 formed on the insulation layer 42, a protective layer 44 formed on the second silicon layer 43 and a ground hole GH extending from an upper portion of the protective layer 44 to a portion of the first silicon layer 41. The ground hole GH has a conductive material layer CM therein. Unexplained reference numeral SH denotes a signal hole.

The first silicon layer 41 serves as a handle wafer, or base wafer. The insulation layer 42 is formed of silicon oxide. In the case that a structure in the SOI wafer is a gyroscope or accelerometer, the insulation layer 42 serves as a sacrificial layer for providing a vacant space over which the structure may move. The second silicon layer 43 is formed of silicon and has a desired structure acting as device components. The protective layer 44 is formed of glass material and serves as a cover to protect the second silicon wafer 43.

In the MEMS device in accordance with the preferred embodiment of the present invention, the ground hole GH formed in the protective layer 44 is formed to extend to the first silicon layer 41 through the second silicon layer 43 and the insulation layer 42. With the conductive material layer CM formed in the extended ground hole GH, a lower portion of the ground hole GH is electrically connected to the first silicon layer 41.

The conductive material layer CM may be formed to completely fill the ground hole GH or be a thin film formed on an inner surface of the ground hole GH. The conductive material layer CM may be formed to extend from an upper portion of the protective layer to a lower portion of the extended ground hole GH. A deposition process or a plating process may be used for forming the conductive material layer CM in the ground hole GH. This may be applied to other embodiments of the present invention to be described below.

The bottom surface of the first silicon layer 41 of the MEMS device 40 in accordance with the present invention is attached to a grounded surface of a printed circuit board PCB by a conductive adhesive.

A method for fabricating and grounding an MEMS device using an SOI wafer in accordance with a second aspect or a third aspect of the present invention will be described below with reference to FIG. 5. In drawings accompanied herewith, like elements are designated by a like reference number.

Figure 5:
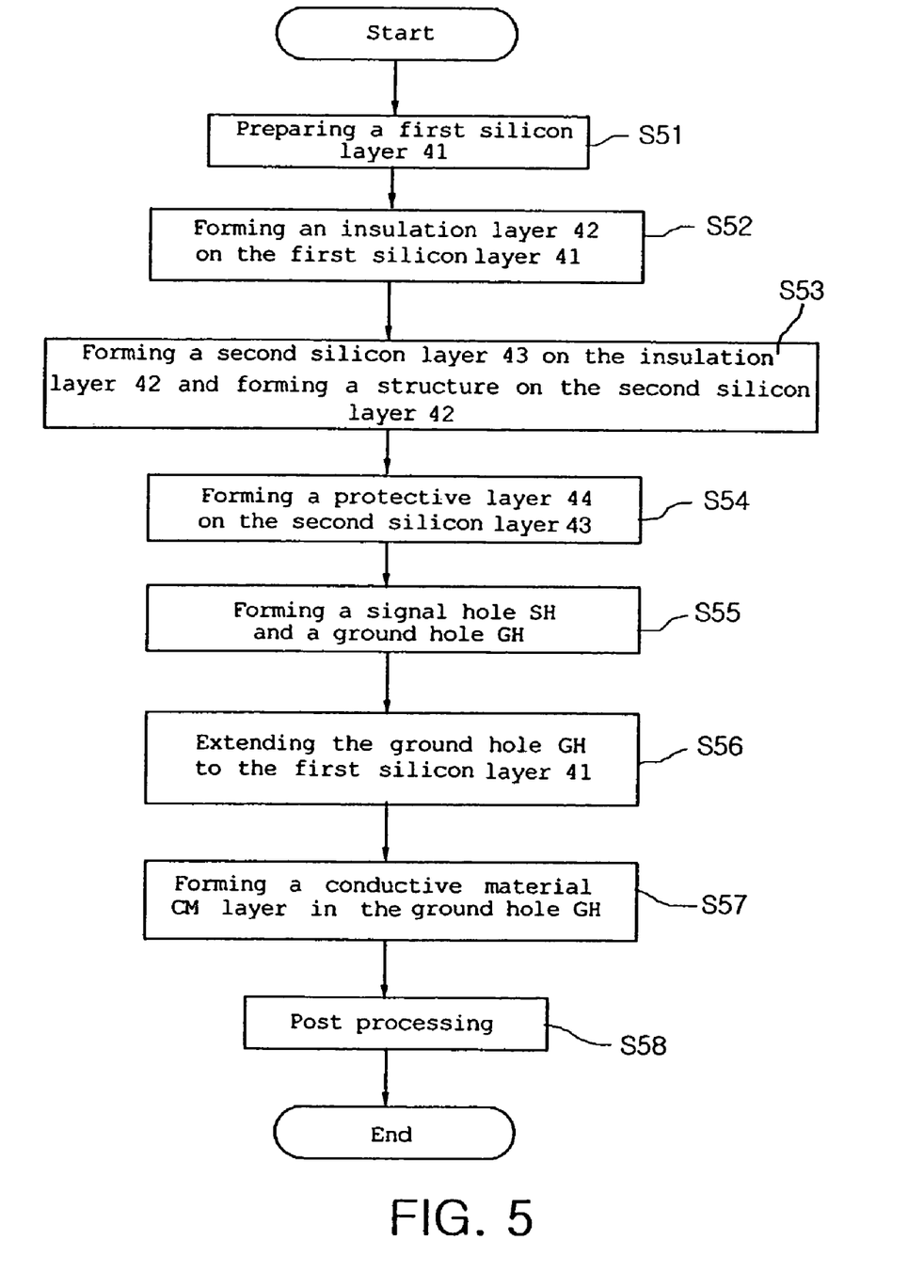
FIG. 5 is a flow chart showing a method for fabricating and grounding an MEMS device in accordance with the present invention.

FIG. 5 is a flow chart showing a method for fabricating and grounding an MEMS device in accordance with the present invention, and FIGS. 6A to 6G are exemplary sectional views of an MEMS device for showing a method for fabricating and grounding an MEMS device using an SOI wafer in accordance with the present invention.

Figure 6A:
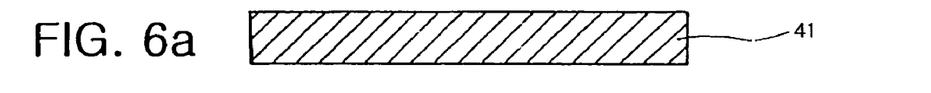
FIGS. 6A to 6G are exemplary sectional views sequentially showing a method for fabricating and grounding an MEMS device in accordance with the present invention.

Referring to FIG. 5 and FIG. 6A, in a first step S51, a first silicon layer 41 serving as a handle wafer is prepared.

Figure 6B:
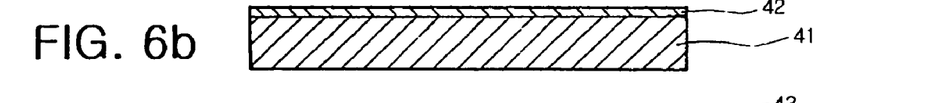

Referring to FIG. 5 and FIG. 6B, in a second step S52, an insulation layer 42 acting as a sacrificial layer is formed on the first silicon layer 41

Figure 6C:
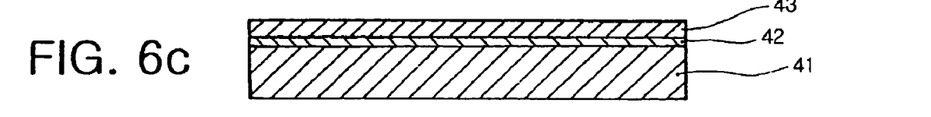

Referring to FIG. 5 and FIG. 6C, in a third step S53, a second silicon layer 43 serving as a device layer is formed on the insulation layer 42.

Figure 6D:
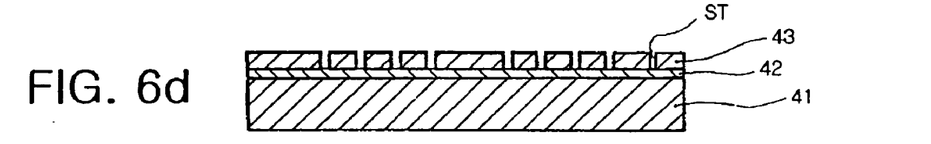

At this time, with reference to FIG. 6D, the second silicon layer 43 may have a desired structure acting as device components of an MEMS device. In FIG. 6D, a reference numeral ST denotes a slit which may not be formed during a method for fabricating and grounding an MEMS device in accordance with a first example but formed during a method in accordance with a second example.

Figure 6E:
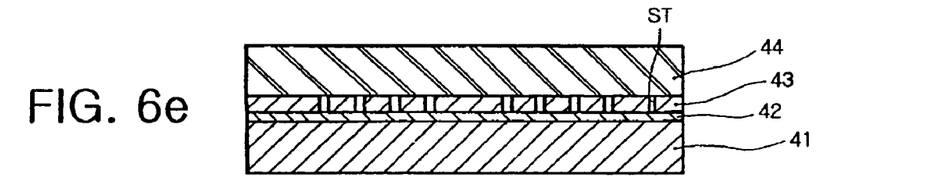

Referring to FIG. 5 and FIG. 6E, in a fourth step S54, a protective layer 44 serving as a cover is formed on the second silicon layer 43 for protecting the same.

Figure 6F:
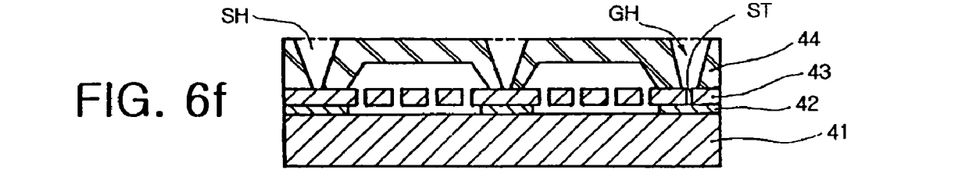

Referring to FIG. 5 and FIG. 6F, in a fifth step S55/S56, a signal hole SH and a ground hole GH are formed in the protective layer 44 (S55) and then the ground hole GH is extended to the first silicon layer 41 through the second silicon layer 43 and the insulation layer 42 (S56). This step S55/S56 will be described in further detail below.

Figure 6G:
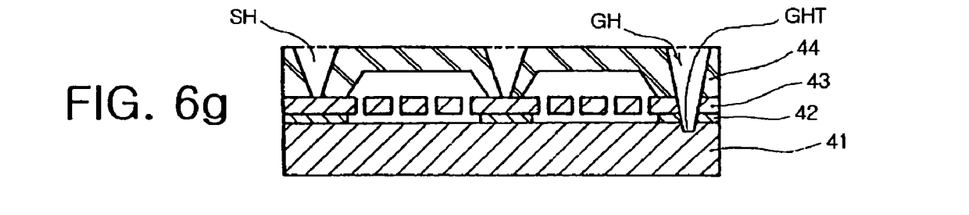

Referring to FIG. 5 and FIG. 6G, in a sixth step S57/S58, a conductive material layer CM is formed in the ground hole GH for electrically connecting the ground hole GH to the first silicon layer 41 (S57) and a post process S58 is performed. The conductive material layer Cm may be formed to completely fill the ground hole GH or be a thin film for just coating inner surfaces of the ground hole GH. The conductive material layer CM may be formed using a deposition process or a plating process. By the post process, it is possible to achieve an enhanced adhesion between the protective layer made of glass material and the silicon layer in the ground hole GH and the signal hole SH.

A method for fabricating and grounding an MEMS device in accordance with the second aspect of the present invention will be described below with reference to FIGS. 7A and 7B.

Figure 7A:
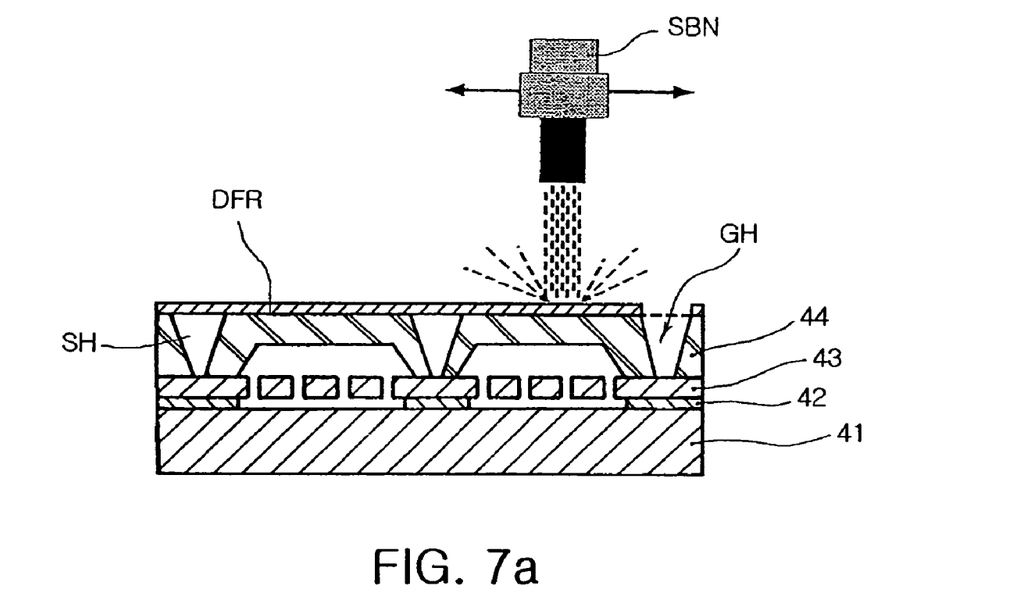
FIGS. 7A and 7B are sectional views of an MEMS device showing a method for fabricating and grounding an MEMS device in accordance with a first example of the method shown in FIG. 5, FIGS. 8A and 8B are sectional views of an MEMS device showing a method for fabricating and grounding an MEMS device in accordance with a second example of the method shown in FIG. 5.
Figure 7B:
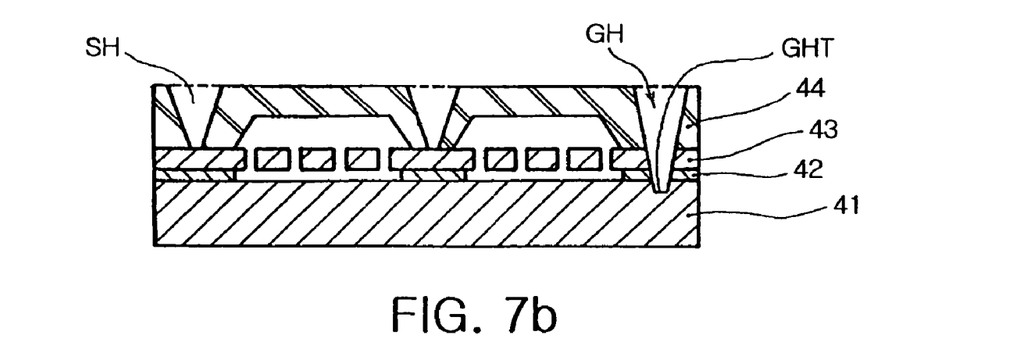

FIGS. 7A and 7B illustrate sectional views of an MEMS device for showing in further detail the fifth step S55/S56 shown in FIG. 5 in accordance with a first example of the method for fabricating and grounding an MEMS device. Referring to FIG. 7A, in a first sub-step of the fifth step S55/S56, a dry film resist DFR is formed on the protective layer 44, without covering the ground hole GH. Next, with reference to FIG. 7B, in a second sub-step of the fifth step S55/S56, the ground hole GH is extended to the first silicon layer 41 through the second silicon layer 43 and the insulation layer 42 by etching the second insulation layer 43 and the insulation layer 42 in the ground hole GH.

The fifth step S55/S56 will be described below in further detail. That is, in the first sub-step, a dry film resist DFR is formed on the protective layer 44, without covering the ground hole GH. Next, in the second sub-step, sand power is injected into the ground hole GH, so that the ground hole GH is extended to the first silicon layer 41 through the second silicon layer 43 and the insulation layer 42.

In other words, in accordance with the second aspect of the present invention, after the ground hole is formed, a surface of the MEMS device is machined again for enabling the ground hole GH to be connected to the handle wafer to extend to the handle wafer to be attached to a packaging member. In the fifth step S55/S56, the sand powder may be injected through sand blaster nozzles SBN provided in a sand blaster.

That is, after the SOI wafer and a glass wafer are bonded with each other, only a ground hole is subject to machining again, so that the ground hole extends to the handle wafer. For re-machining the ground hole, a sand blaster may be used.

In other words, on one SOI wafer, several hundreds or several thousands of ground holes are provided. Accordingly, for extending such great numbers of the ground holes to the handle wafer in a short time, the dry film resist DFR having resistance to sand blasting is applied to the SOI wafer and then patterned to open the ground holes by using a photolithography process. After the ground holes are opened, the sand power is injected into the ground hole for a predetermined period of time. During the injection of the sand power, the sand powder penetrates the device wafer and the sacrificial layer through the opened ground holes, so that the ground holes are extended to the handle wafer.

A method for fabricating and grounding an MEMS device in accordance with a third aspect of the present invention will be described with reference to FIGS. 8A and 8B.

Figure 8A:
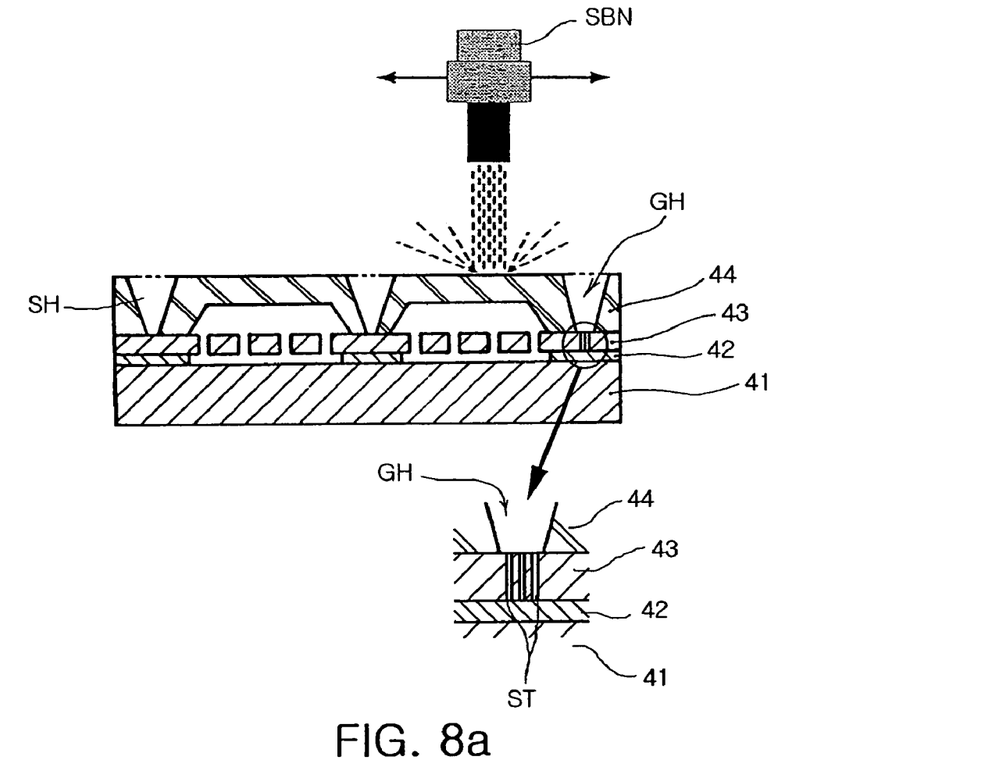
Figure 8B:
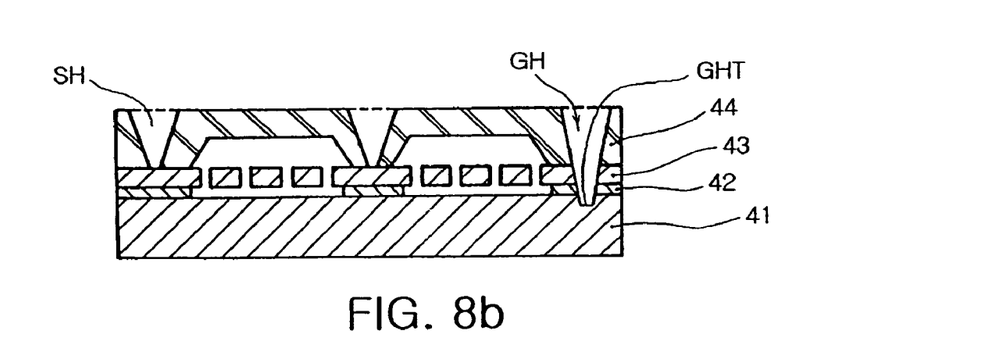

FIGS. 8A and 8B are sectional views showing a method for fabricating and grounding an MEMS device in accordance with a second example of the method of the present invention. In this method according to the third aspect of the present invention, a third step S53 and a fifth step S55/S56 are different from the method according to the second aspect of the present invention and other steps are the same as the second aspect of the present invention.

Referring to FIG. 6D, in the third step S53, a plurality of slits ST are formed in a second silicon wafer S43 at a portion where a ground hole is to be formed. In the fifth step S55/S56, a ground hole GH and a signal hole SH are formed in a protective layer 44. After that, as shown in FIGS. 8A and 8B, the ground hole GH is extended to a first silicon layer 41 through the second silicon layer 43 and the insulation layer 42.

The slits ST may have a shape of slits or through holes.

In brief, in accordance with the third aspect of the present invention, the slits ST are formed in the device wafer and then the MEMS device is packaged. After packaging, the ground hole is machined again, so that the ground hole is connected to the handle wafer.

The method according to the third aspect of the present invention is simpler than the method according to the second aspect of the present invention because the DFR is not needed. As shown in FIGS. 8A and 8B, the entire surface of the MEMS device is exposed to the sand powder. Accordingly, groundwork should be laid so that a surface area exposed through the ground hole is more rapidly etched than the other surface area of the MEMS device.

The groundwork comprises scratching or etching the device wafer at a portion where the ground hole is to be formed.

Further, in the fifth step S55/S56, the ground hole may be extend to the handle wafer in various manners such as an etching process and a sand blasting process. In the case of using the sand blasting process, sand powder may be injected into the ground hole through sand blaster nozzles provided in a sand blaster.

After performing the groundwork, the device wafer in the ground hole becomes brittle. As a result, when the sand blasting process is performed, the ground hole extends to the handle wafer in advance before other holes (signal hole) reach to the handle wafer. Since the sand blasting stops when the ground hole reaches to the handle wafer, the signal hole does not extend to the handle wafer. Further, when the ground hole reaches to the handle wafer, the ground hole is getting bigger in its size and thus a surface area of the protective layer (glass material) in the ground hole is enlarged. Therefore, it is possible to achieve a good adhesion of a metal layer (conductive material) to an inner surface of the ground hole so that a bonding force between the protective layer (glass material) and the silicon layer is enhanced.

As described above, since the present invention provides an electrical connection in the ground hole from the upper surface of the glass layer (protective layer) to the handle wafer during a fabrication of the MEMS device, the handle wafer of the MEMS device in accordance with the present invention may be easily grounded through a body of the MEMS device without any additional bonding or wiring process.

In a typical SOI wafer for fabricating an MEMS device, an insulation layer, or sacrificial layer has a thickness of several Ems that is relatively thin in comparison with a thickness of a device wafer, so that the method in accordance with the present invention may be easily realized without a great deal of difficulty.

In accordance with the present invention as described above, in the case that the MEMS device using an SOI wafer is mounted on a printed circuit board by a flip chip bonding method, a conductive layer in the MEMS device and the handle wafer may be connected to the PCB without any additional process such as a wiring or bonding process, and further the handle wafer and the conductive layer in the MEMS device may be easily electrically connected to each other. Accordingly, electrical noise reduction characteristic of the MEMS device is improved.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating and grounding an MEMS device using an SOI wafer, comprising:
    a first step of preparing a first silicon layer;
    a second step of forming an insulation layer on the first silicon layer;
    a third step of forming a second silicon layer on the insulation layer and forming a plurality of slits and a predetermined structure on the second silicon layer, wherein the slits are formed to penetrate the second silicon layer at a location where a ground hole is to be formed;
    a fourth step of forming a protective layer on the second silicon layer;
    a fifth step of forming a signal hole and a ground hole in the protective layer and extending the ground hole to the first silicon layer through the second silicon layer and the insulation layer; and
    a sixth step of forming a conductive material layer in the ground hole.

2. The method as set forth in claim 1, wherein the fifth step comprises etching the second silicon layer and the insulation layer in the ground hole, thereby extending the ground hole to the first silicon layer.

3. The method as set forth in claim 1, wherein the fifth step comprises injecting sand power into the ground hole, thereby extending the ground hole to the first silicon layer through the second silicon layer and the insulation layer.

4. The method as set forth in claim 3, wherein the sand powder is injected into the ground hole through sand blaster nozzles.

* * * * *